United States Patent [19]
Pan et al.

[11] Patent Number: 5,510,214
[45] Date of Patent: Apr. 23, 1996

[54] DOUBLE DESTRUCTION PHASE SHIFT MASK

[75] Inventors: Hong-Tsz Pan, Chang-Hua; Ming-Tzong Yang, Hsin Chu, both of Taiwan

[73] Assignee: United Microelectronics Corporation, Hsinchu, Taiwan

[21] Appl. No.: 318,425

[22] Filed: Oct. 5, 1994

[51] Int. Cl.⁶ ........................................ G03F 9/00
[52] U.S. Cl. ...................... 430/5; 430/321; 430/324; 216/51; 216/46
[58] Field of Search .................. 430/5, 321, 324; 156/652, 653

[56] References Cited

U.S. PATENT DOCUMENTS

| | | | |
|---|---|---|---|
| 5,045,417 | 9/1991 | Okamoto | 430/5 |
| 5,190,836 | 3/1993 | Nakagawa et al. | 430/5 |
| 5,194,344 | 3/1993 | Cathey, Jr. et al. | 430/5 |
| 5,194,345 | 3/1993 | Rolfson | 430/5 |
| 5,194,346 | 3/1993 | Rolfson et al. | 430/5 |
| 5,208,125 | 5/1993 | Lowrey et al. | 430/5 |
| 5,217,830 | 6/1993 | Lowrey | 430/5 |
| 5,225,035 | 7/1993 | Rolfson | 156/643 |
| 5,286,581 | 2/1994 | Lee | 430/5 |
| 5,290,647 | 3/1994 | Miyazaki et al. | 430/5 |
| 5,380,608 | 1/1995 | Miyashita | 430/5 |

OTHER PUBLICATIONS

"Lithography's Leading Edge, Part 1: Phase Shift Technology", pub. in Semiconductor International, Feb. 1992, pp. 42–47.

*Primary Examiner*—S. Rosasco
*Attorney, Agent, or Firm*—George O. Saile; Larry J. Prescott

[57] ABSTRACT

This invention describes the use and methods of fabrication of a double destruction phase shift mask. The double destruction phase shift mask combines transparent phase shifting regions and attenuating phase shifting regions to form interference patterns in light projected through the mask which reduce the light intensity to nearly zero in the regions of the projected light corresponding to pattern elements. This eliminates the ghost line which can occur with conventional phase shifting masks. The double destruction phase shift mask provides improved depth of focus and edge definition.

23 Claims, 6 Drawing Sheets

DOUBLE DESTRUCTION PHASE SHIFT MASK

BACKGROUND OF THE INVENTION (1) Field of the Invention

The invention relates to the use of a double destruction phase shift mask and to methods of forming the double destruction phase shift mask. The double destruction provides improved pattern definition and depth of focus in the sub-half micron range and avoids the problem of ghost lines which can occur with conventional phase shift masks.

(2) Description of the Related Art

As optical lithography advances to 0.5 to 0.35 microns and below new technologies are needed to improve the resolution of the imaging lens. Phase-shifting photomasks have been used to improve resolution as well as depth of focus. Phase shifting processes are described in U.S. Pat. No. 5,045,417 to Okamoto, U.S. Pat. No. 5,194,344 to Cathey Jr. et al, U.S. Pat. No. 5,194,345 to Rolfson, U.S. Pat. No. 5,194,346 to Rolfson et al, U.S. Pat. No. 5,208,125 to Lowrey et al, U.S. Pat. No. 5,217,830 to Lowrey, and U.S. Pat. No. 5,225,035 to Rolfson. The methods used in these phase shifters usually use an opaque material in conjunction with a phase shifting material. U.S. Pat. No. 5,190,836 to Nakagawa et al, describes a phase shifter using reflection techniques. Phase shift techniques are described in a paper "LITHOGRAPHY'S LEADING EDGE, PART 1: PHASE-SHIFT TECHNOLOGY," published in Semiconductor International, February 1992, pages 42–47.

SUMMARY OF THE INVENTION

It is a principle object of this invention to provide a double destruction phase shift mask for use in fabricating integrated circuits in the sub-half micron range. The double destruction phase shift mask uses phase shifting techniques to achieve required edge definition and depth of focus but avoids the problem of ghost lines which occur when using conventional phase shift masks. The double destruction phase shift mask is used in a five times reduction projection stepper.

It is a further object of this invention to provide a method of forming a double destruction phase shift mask.

These objectives are achieved by forming a first pattern of the mask using attenuating phase shifting material. Light passing through the attenuating phase shifting material is attenuated and shifted in phase by 180° as it is focussed on the surface of the integrated circuit wafer under manufacture. A second pattern of the mask lies completely within the first pattern of the mask and forms a gap width between the edge of the first pattern and the edge of the second pattern. The second pattern of the mask is formed from transparent phase shifting material. Light passing through the second pattern of the mask also passes through the first pattern of the mask so that it is both attenuated and shifted in phase by 360°, which is equivalent to no phase shift, as the light is focussed on the integrated circuit wafer under manufacture.

When an element of the feature pattern is focussed on the integrated circuit wafer the light amplitude is attenuated and shifted in phase by 180° at the edges of the feature pattern element while in the center portion of the feature pattern element the light amplitude is attenuated and shifted in phase by 360°, which is equivalent to 0°. The light interaction at the surface of the wafer produces a light intensity pattern that is very nearly zero over the entire element of the feature pattern and there are no resulting ghost lines. In previous masks using phase shifting technology the light intensity pattern deviates slightly from zero over the element of the feature pattern and ghost lines result.

The double destruction phase shifting mask is formed using vertical anisotropic etching to form the first pattern of the mask. Isotropic etching is then used to undercut the transparent phase shifting material to form the second pattern of the mask.

DESCRIPTION OF THE PREFERRED EMBODIMENTS

Figure 1:
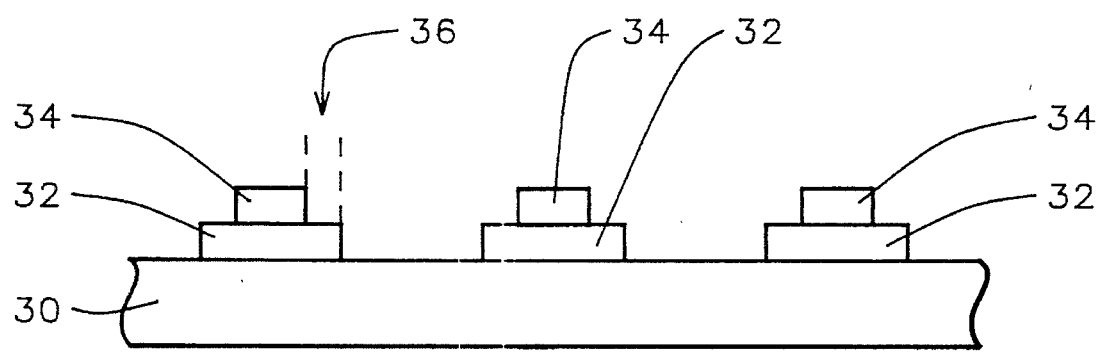
FIG. 1 is a cross section of the first type double destruction phase shifting mask.

Refer now to FIG. 1, FIG. 3, FIG. 4, and FIG. 5, there is shown an embodiment of the double destruction phase shift mask. FIG. 1 shows a cross section of the first type of double destruction phase shift mask. The mask comprises a quartz substrate 30 with a first pattern of attenuating phase shifting material 32, such as MoSiON, with a thickness of between about 1200 and 2000 Angstroms formed on the quartz substrate, A second pattern of transparent phase shifting material 34, such as spin-on-glass, with a thickness of between about 3800 and 4200 Angstroms is formed on the first pattern of attenuating phase shifting material. The second pattern lies entirely within the perimeter of the first pattern and forms an edge width 36, of between about 0.25 and 0.5 microns between the second pattern edge of transparent phase shifting material and the first pattern edge of attenuating phase shifting material.

Figure 3:
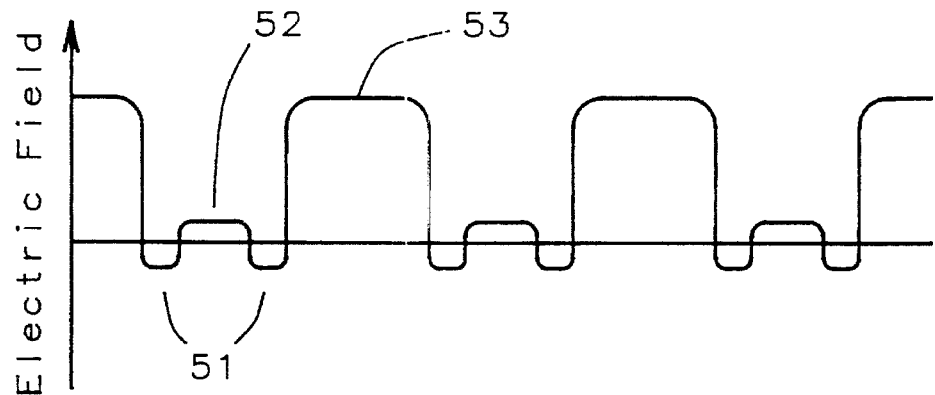
FIG. 3 is the light amplitude pattern at the surface of the integrated circuit wafer using either the first or second type double destruction phase shifting mask.
Figure 4:
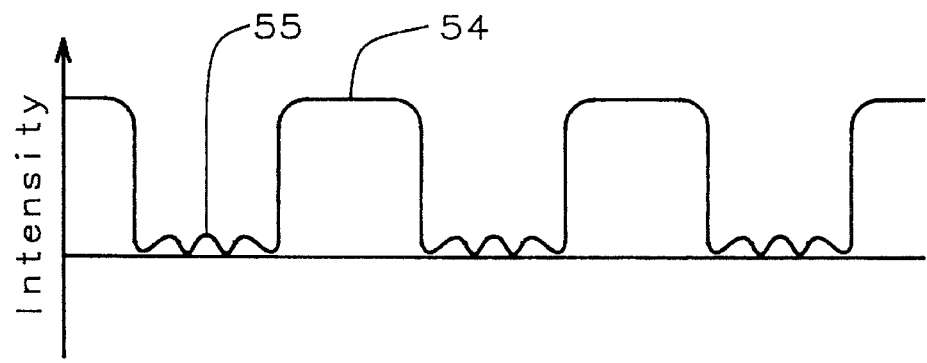
FIG. 4 is the light intensity pattern at the surface of the integrated circuit wafer using either the first or second type double destruction phase shifting mask.

The double destruction phase shift mask is used with a five times reduction stepper to form a feature pattern on an integrated circuit wafer. Light passing through the attenuating phase shifting material 32 is both attenuated and shifted in phase by 180°. Light passing through the transparent phase shifting material 34 is shifted in phase by 180° without attenuation. Light which passes through both the transparent phase shifting material 34 and the attenuating phase shifting material 32 is both attenuated and shifted in phase by 360°, which is equivalent to no phase shift. FIG. 3 shows the electric field of the light focussed on the surface of the integrated circuit wafer. The electric field of the light passing only through the attenuating phase shifting material 51 is both attenuated and shifted in phase by 180°. The electric field of the light passing through both the attenuating phase shifting material and the transparent phase shifting material 52 is attenuated and shifted in phase by 360°, which is equivalent to no phase shift. The electric field of the light passing through only the quartz substrate 53 is neither attenuated nor shifted in phase. FIG. 4 shows the intensity of the light at the surface of the integrated circuit wafer. Due to the interference effects of the phase shifted electric field, the intensity of light passing through the pattern formed in the attenuating phase shifting material 55 is nearly zero over the entire pattern and very small compared to the intensity of the light passing through the quartz substrate only 54.

Figure 5:
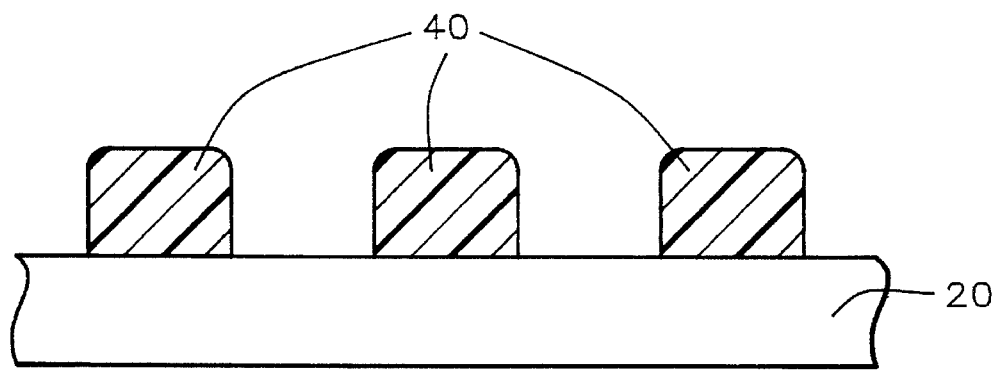
FIG. 5 is a cross section of the photoresist pattern at the surface of the integrated circuit wafer using either the first or second type double destruction phase shifting mask.

FIG. 5 shows the photoresist pattern 40 on the integrated circuit wafer 20 resulting from the light intensity of FIG. 4. Since the intensity of the light passing through the attenuating phase shifting material is nearly zero the corresponding photoresist pattern 40 is uniform and does not have the variations in uniformity which can occur if the light intensity deviates appreciably from zero over this region. Such variations in photoresist uniformity can produce undesirable ghost lines.

Figure 2:
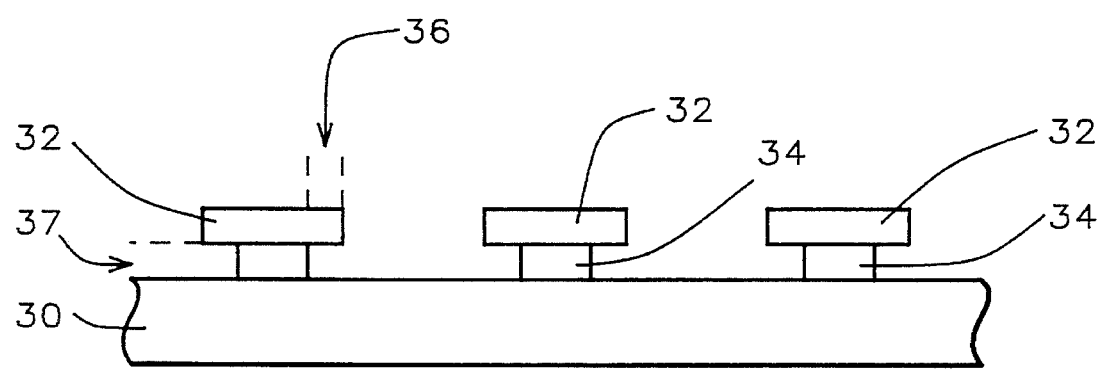
FIG. 2 is a cross section of the second type double destruction phase shifting mask.

Refer now to FIG. 2, FIG. 3, FIG. 4, and FIG. 5, there is shown another embodiment of the double destruction phase shift mask. FIG. 2 shows a cross section of the second type of double destruction phase shift mask. The mask comprises a quartz substrate 30 with a second pattern 34 etched in the top surface of the quartz substrate to a depth 37 of between about 3800 and 4200 Angstroms. A first pattern of attenuating phase shifting material 32 such as MoSiON with a thickness of between about 1200 and 2000 Angstroms is formed over the second pattern 34. The second pattern lies entirely within the perimeter of the first pattern which overhangs the second pattern forming an edge width 36, of between about 0.25 and 0.5 microns between the second pattern edge of quartz and the first pattern edge of attenuating phase shifting material. Quartz is a transparent phase shifting material.

The operation of the mask proceeds as described in the previous embodiment producing the electric field of the light at the integrated circuit wafer shown in FIG. 3, the light intensity at the integrated circuit wafer shown in FIG. 4, and the photoresist pattern at the integrated circuit wafer shown in FIG. 5.

Figure 6A:
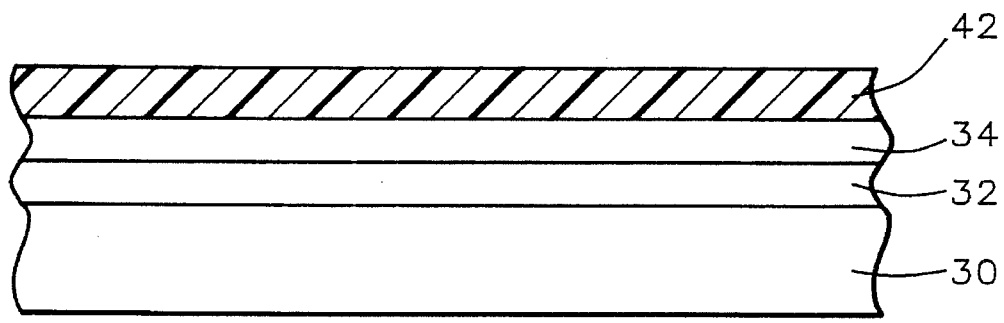
FIG. 6A is a cross section of the first type double destruction phase shift mask after the attenuating phase shifting material, the transparent phase shifting material, and photoresist have been formed on the quartz substrate.

Refer now to FIG. 6A through FIG. 6D and FIG. 1, there is shown an embodiment of a method of forming the double destruction phase shift mask. FIG. 6A shows a cross section of a quartz substrate 30, having a thickness of between about 1 and 6 millimeters with a layer of attenuating phase shifting material 32, such as MoSiON with a thickness of between about 1200 and 2000 Angstroms, formed on the quartz substrate. A layer of transparent phase shifting material 34, such as spin-on-glass with a thickness of between about 3800 and 4200 Angstroms, is formed on the layer of attenuating phase shifting material.

Figure 6B:
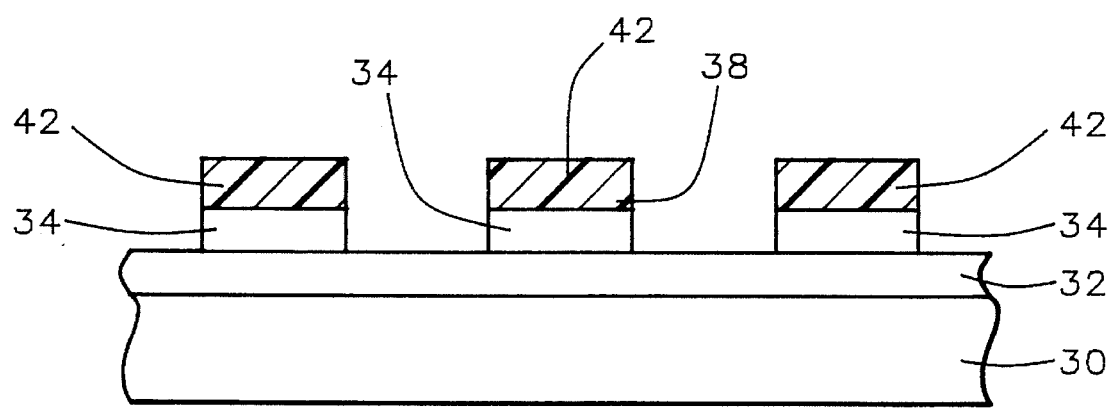
FIG. 6B is a cross section of the first type double destruction phase shift mask after the first pattern of the mask has been formed in the photoresist and the transparent phase shifting material.
Figure 6C:
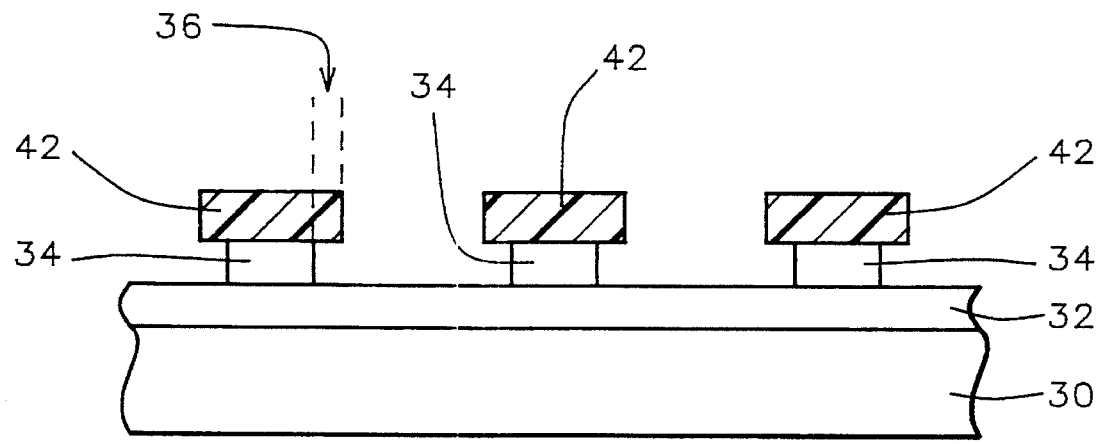
FIG. 6C is a cross section of the first type double destruction phase shift mask after undercutting the transparent phase shifting material to form the second pattern of the mask.

As shown in FIG. 6B a pattern is formed in the photoresist 42 using laser beam techniques. The pattern is then vertically anisotropically etched in the layer of transparent phase shifting material 34 by means of reactive ion etching. Next, as shown in FIG. 6C, a buffered oxide etch of $HF:NH_4F:H_2O$ is used to undercut the transparent phase shifting material 34 thereby forming the edge width region 36 between the edge of the transparent phase shifting material and the edge of the photoresist.

Figure 6D:
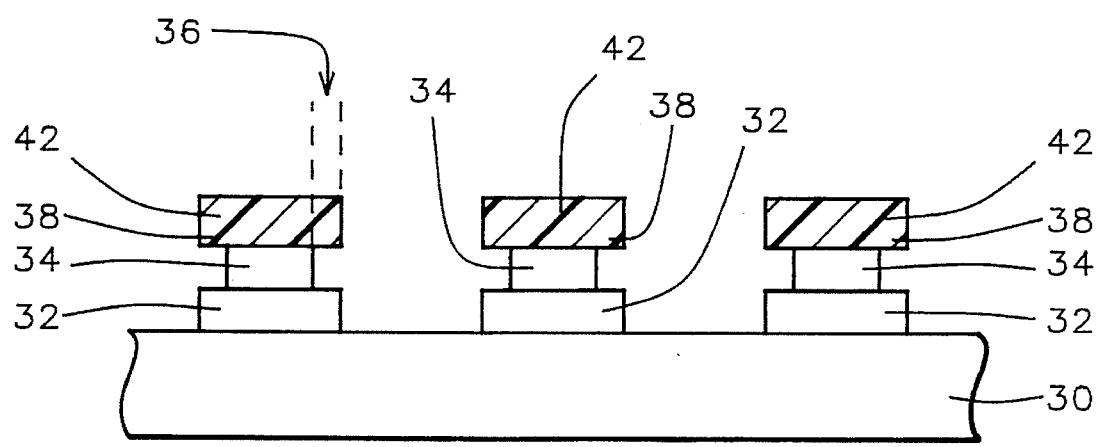
FIG. 6D is a cross section of the first type double destruction phase shift mask after reactive ion etch of the attenuating phase shifting material to form the first pattern of the mask.

Next, as shown in FIG. 6D, the layer of attenuating phase shifting material 32 is etched to the pattern of the photoresist 42 using reactive ion etching. The edge width 36 is formed between the edge of the transparent phase shifting material pattern 34 and the edge of the attenuating phase shifting material pattern 32 and is between about 0.25 and 0.5 microns. Next, as shown in FIG. 1, the photoresist and the thin conductive material are removed and the double destruction phase shift mask of the first type is formed.

Figure 7A:
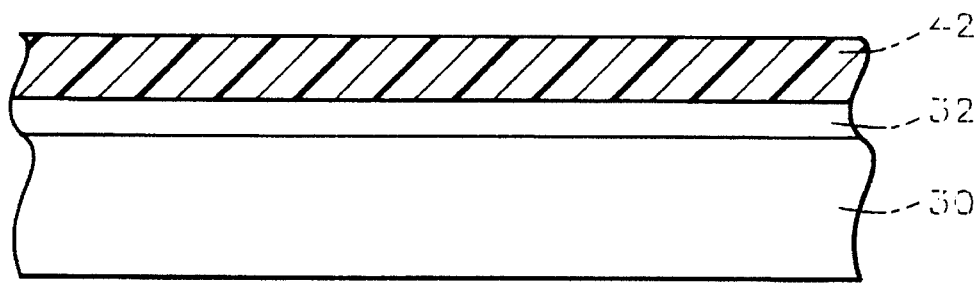
FIG. 7A is a cross section of the second type double destruction phase shift mask after the attenuating phase shifting material and the photoresist have been formed on the quartz substrate.

Refer now to FIG. 7A through FIG. 7D and FIG. 2, there is shown another embodiment of a method of forming the double destruction phase shift mask. FIG. 7A shows a cross section of a quartz substrate 30, having a thickness of between about 1 and 6 millimeters with a layer of attenuating phase shifting material 32, such as MoSiON with a thickness of between about 1200 and 2000 Angstroms, formed on the quartz substrate and a layer of photoresist 42 formed on the layer of attenuating phase shifting material. The layer of attenuating phase shifting material has sufficient conductivity so that electron beam techniques can be used to form the pattern in the layer of photoresist 42 without an additional layer of conductive material.

Figure 7B:
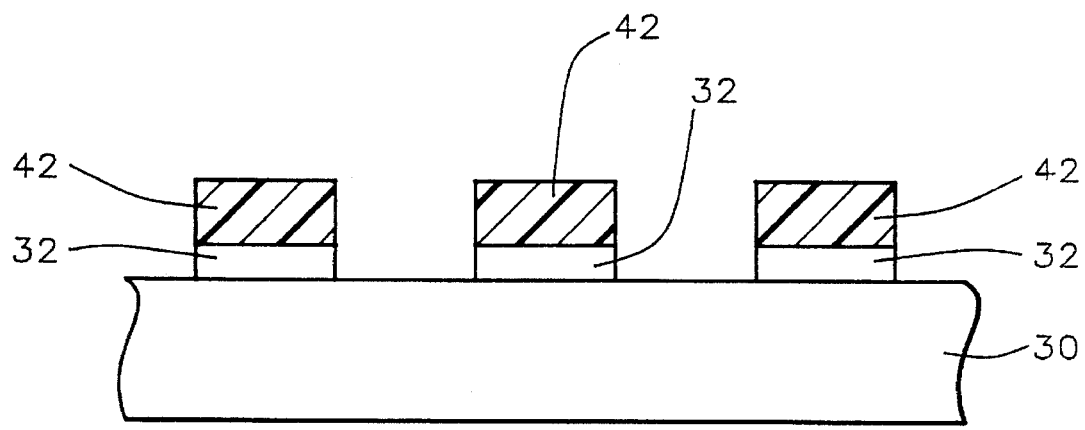
FIG. 7B is a cross section of the second type double destruction phase shift mask after the first pattern of the mask has been formed in the photoresist and the attenuating phase shifting material.
Figure 7C:
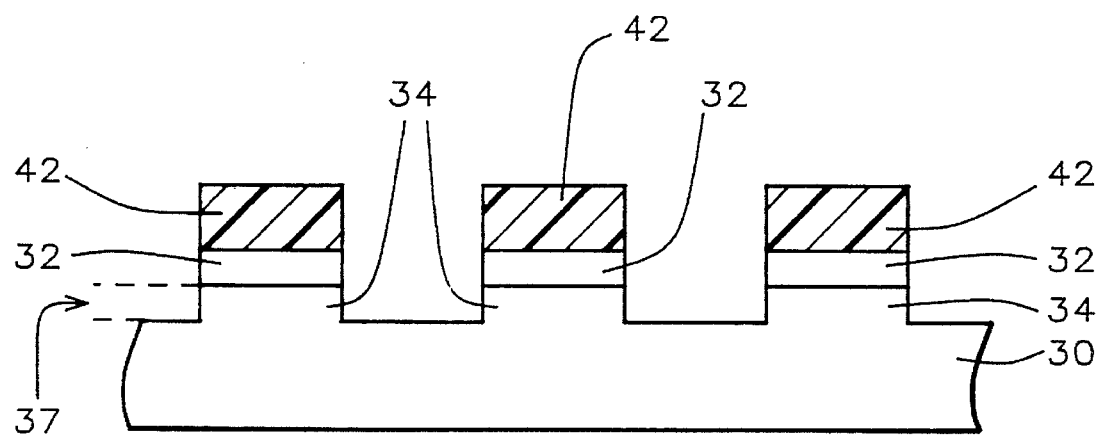
FIG. 7C is a cross section of the second type double destruction phase shift mask after the first pattern of the mask has been etched in the surface of the quartz substrate.
Figure 7D:
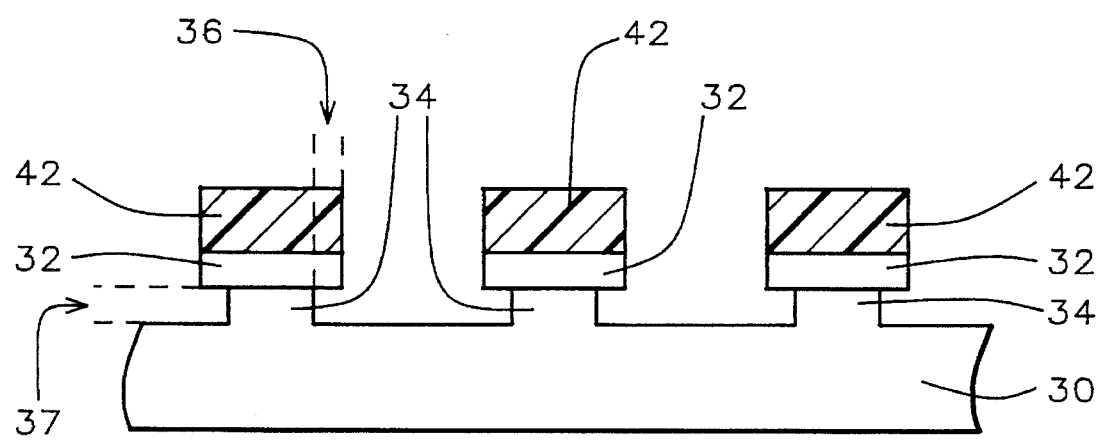
FIG. 7D is a cross section of the second type double destruction phase shift mask after the second pattern of the mask has been etched in the quartz substrate.

Next, as shown in FIG. 7B, a pattern is formed in the photoresist 42 using electron beam techniques and this pattern is then formed in the layer of attenuating phase shifting material 32 by means of vertical anisotropic etching using reactive ion etching. Next, as shown in FIG. 7C, the pattern is vertically anisotropically etched in the top of the quartz substrate 34 to a depth 37 of between about 0 and 2500 Angstroms by means of reactive ion etching. Next, as shown in FIG. 7D, the pattern in the top of the quartz substrate 34 is isotropically etched using buffered HF thereby undercutting the quartz under the edge of the pattern in the layer of attenuating phase shifting material 32 and forming an edge width 36 of between about 2500 and 5000 Angstroms between the edge of the pattern formed in the quartz 34 and the edge of the pattern formed in the attenuating phase shifting material 32. Next, as shown in FIG. 2, the photoresist is removed and the double destruction phase shift mask of the second type is formed.

While the invention has been particularly shown and described with reference to the preferred embodiments thereof, it will be understood by those skilled in the art that various changes in form and details may be made without departing from the spirit and scope of the invention.

What is claimed is:

1. A double destruction phase shift mask, comprising:

a quartz substrate with a thickness of between about 1 and 6 millimeters;

a patterned layer of attenuating phase shifting material having edges formed on said quartz substrate;

a patterned layer of transparent phase shifting material having edges formed on said patterned layer of attenuating phase shifting material so that said edges of said patterned layer of attenuating phase shifting material extend beyond said edges of said patterned layer of transparent phase shifting material; and a gap width formed between said edges of said patterned layer of transparent phase shifting material and said edges of said patterned layer of attenuating phase shifting material.

2. The double destruction phase shift mask of claim 1 wherein said patterned layer of attenuating phase shifting material is comprised of MoSiON with a thickness of between about 1200 and 2000 Angstroms.

3. The double destruction phase shift mask of claim 1 wherein said patterned layer of transparent phase shifting material is spin-on-glass with a thickness of between about 3800 and 4200 Angstroms.

4. The double destruction phase shift mask of claim 1 wherein said gap width is between about 0.25 and 0.5 microns.

5. A double destruction phase shift mask, comprising:

a quartz substrate with a thickness of between about 1 and 6 millimeters;

a pattern having edges and a first thickness formed in said quartz substrate by etching away quartz not in said pattern;

a patterned layer of attenuating phase shifting material having edges formed on said pattern formed in said quartz substrate wherein said edges of said patterned layer of attenuating phase shifting material extend beyond said edges of said pattern formed in said quartz substrate; and an overhang width formed between said edges of said pattern formed in said quartz substrate and said edges of said patterned layer of attenuating phase shifting material.

6. The double destruction phase shift mask of claim 5 wherein said patterned layer of attenuating phase shifting material is MoSiON with a thickness of between about 1200 and 2000 Angstroms.

7. The double destruction phase shift mask of claim 5 wherein said first thickness is between about 3800 and 4200 Angstroms.

8. The double destruction phase shift mask of claim 5 wherein said overhang width is between about 0.25 and 0.5 microns.

9. A method of forming a double destruction phase shift mask, comprising the steps of:

providing a quartz substrate with a thickness of between about 1 and 6 millimeters;

forming a layer of attenuating phase shifting material on said quartz substrate;

forming a layer of transparent phase shifting material on said layer of attenuating phase shifting material;

forming a layer of photoresist over said layer of transparent phase shifting material;

forming a pattern with edges in said layer of photoresist thereby forming a photoresist mask;

forming said pattern with edges in said layer of transparent phase shifting material by vertically anisotropically etching said transparent phase shifting material through said photoresist mask;

undercutting said transparent phase shifting material under said photoresist mask using isotropic etching thereby forming a gap width between said edges of said pattern in said layer of phase shifting material and said edges of said pattern in said photoresist;

forming said pattern with edges in said layer of attenuating phase shifting material by vertically anisotropically etching said phase shifting material through said photoresist mask; and removing said photoresist mask.

10. The method of claim 9 wherein said layer of attenuating phase shifting material is MoSiON with a thickness of between about 1200 and 2000 Angstroms.

11. The method of claim 9 wherein said layer of transparent phase shifting material is spin-on-glass with a thickness of between about 3800 and 4200 Angstroms.

12. The method of claim 9 wherein said photoresist mask is formed using laser beam techniques.

13. The method of claim 9 wherein said pattern with edges is formed in said layer of transparent phase shifting material by means of $CHF_3/CF_4$ reactive ion etching.

14. The method of claim 9 wherein said isotropic etching is accomplished using 20:1 buffered HF.

15. The method of claim 9 wherein said gap width is between about 0.25 and 0.5 microns.

16. The method of claim 9 wherein said pattern with edges is formed in said layer of attenuating phase shifting material by means of $Cl_2/O_2$ reactive ion etching.

17. A method of forming a double destruction phase shift mask, comprising the steps of:

providing a quartz substrate with a thickness of between about 1 and 6 millimeters;

forming a layer of attenuating phase shifting material on said quartz substrate;

forming a layer of photoresist on said layer of attenuating phase shifting material;

forming a pattern with edges in said layer of photoresist thereby forming a photoresist mask;

forming said pattern with edges in said layer of attenuating phase shifting material and in a first thickness of the top part of said quartz substrate by means of vertical anisotropic etching through said photoresist mask;

undercutting said first thickness of quartz substrate under said edges of said pattern in said layer of attenuating phase shifting material using isotropic etching of said quartz substrate through said photoresist mask thereby forming a gap width between said edges of said pattern in said quartz substrate and said edges of said pattern in said attenuating phase shifting material; and removing said photoresist mask.

18. The method of claim 17 wherein said layer of attenuating phase shifting material is MoSiON with a thickness of between about 1200 and 2000 Angstroms.

19. The method of claim 17 wherein said photoresist mask is formed using laser beam techniques.

20. The method of claim 17 wherein said pattern with edges is formed in said layer of attenuating phase shifting material and in said first thickness of the top part of said quartz substrate by means of $CHF_3/O_2$ reactive ion etching.

21. The method of claim 17 wherein said isotropic etching is accomplished by means of 20:1 buffered HF.

22. The method of claim 17 wherein said gap width is between about 0.25 and 0.5 microns.

23. The method of claim 17 wherein said first thickness is between about 3800 and 4200 Angstroms.

* * * * *